(12) United States Patent
Umeno et al.

(10) Patent No.: US 8,460,463 B2
(45) Date of Patent: Jun. 11, 2013

(54) SILICON WAFER AND METHOD FOR PRODUCING THE SAME

(75) Inventors: Shigeru Umeno, Tokyo (JP); Manabu Nishimoto, Tokyo (JP); Masataka Hourai, Tokyo (JP)

(73) Assignee: Sumco Corporation, Tokyo (JP)

( * ) Notice: Subject to any disclaimer, the term of this patent is extended or adjusted under 35 U.S.C. 154(b) by 855 days.

(21) Appl. No.: 12/544,448

(22) Filed: Aug. 20, 2009

(65) Prior Publication Data
US 2010/0051945 A1    Mar. 4, 2010

(30) Foreign Application Priority Data

Aug. 28, 2008  (JP) ................ 2008-220052

(51) Int. Cl.
*C30B 15/00* (2006.01)
*C30B 21/06* (2006.01)

(52) U.S. Cl.
USPC .......... 117/20; 117/13; 117/14; 117/19; 423/424; 423/425

(58) Field of Classification Search
USPC ............ 117/13, 14, 19, 20; 423/424, 425
See application file for complete search history.

(56) References Cited

U.S. PATENT DOCUMENTS

| | | | |
|---|---|---|---|
| 6,117,231 A | 9/2000 | Fusegawa et al. | |
| 6,300,680 B1 | 10/2001 | Horikawa et al. | |
| 6,413,310 B1 | 7/2002 | Tamatsuka et al. | |
| 6,428,619 B1 | 8/2002 | Koya et al. | |
| 6,682,597 B2 * | 1/2004 | Koya et al. | 117/84 |
| 7,320,731 B2 * | 1/2008 | Ono et al. | 117/20 |
| 7,344,689 B2 | 3/2008 | Umeno et al. | |
| 7,563,319 B2 | 7/2009 | Umeno et al. | |
| 2003/0148634 A1 | 8/2003 | Holzl et al. | |
| 2005/0229842 A1 | 10/2005 | Umeno et al. | |
| 2006/0156969 A1 | 7/2006 | Hourai et al. | |
| 2007/0000427 A1 | 1/2007 | Umeno et al. | |
| 2007/0193501 A1 | 8/2007 | Ono et al. | |
| 2008/0102287 A1 | 5/2008 | Umeno et al. | |

FOREIGN PATENT DOCUMENTS

| | | |
|---|---|---|
| CN | 1200559 | 12/1998 |
| CN | 1692482 | 11/2005 |
| EP | 0170856 | 2/1986 |
| EP | 1513193 | 3/2005 |
| EP | 1811065 | 7/2007 |
| JP | 61-036197 | 2/1986 |
| JP | 61-114537 | 6/1986 |
| JP | 5-043384 | 2/1993 |
| JP | 5-074784 | 3/1993 |

(Continued)

OTHER PUBLICATIONS

English language Abstract of JP 2006-344823, Dec. 21, 2006.

(Continued)

*Primary Examiner* — Bac Au
(74) *Attorney, Agent, or Firm* — Greenblum & Bernstein, P.L.C.

(57) ABSTRACT

A silicon wafer is produced through the steps of forming a silicon ingot by a CZ method with an interstitial oxygen concentration of not more than $7.0 \times 10^{17}$ atoms/cm$^3$ and with a diameter of a COP occurring region not more than a diameter of a crystal, slicing a wafer from the silicon ingot after doping the silicon ingot with phosphorus, forming a polysilicon layer or a strained layer on one main surface of the wafer, and mirror polishing the other main surface of the wafer.

5 Claims, 2 Drawing Sheets

FOREIGN PATENT DOCUMENTS

| | | |
|---|---|---|
| JP | 2000-007486 | 1/2000 |
| JP | 2001-146496 | 5/2001 |
| JP | 2002-029891 | 1/2002 |
| JP | 2002-128591 | 5/2002 |
| JP | 2006-344823 | 12/2006 |
| KR | 1999-0087977 | 12/1999 |
| KR | 2001-0031444 | 4/2001 |
| WO | 2004/073057 | 8/2004 |
| WO | 2004/083496 | 9/2004 |

OTHER PUBLICATIONS

U.S. Appl. No. 12/544,482 to Shigeru Umeno et al., filed Aug. 20, 2009.

Sinichiro Takasu et al., "Neutron Transmuted Magnetic Czochralski Grown Silicon Wafer for Power Device," 19th Annual IEEE Power Electronics Specialists Conference, IEEE, New York, United States, pp. 1339-1345, 1988.

* cited by examiner

SILICON WAFER AND METHOD FOR PRODUCING THE SAME

BACKGROUND OF THE INVENTION

1. Field of the Invention

The present invention relates generally to a silicon wafer and a method for producing the same. Although not limited, the present invention relates more specifically to a silicon wafer which is formed through a Czochralski method (hereinafter referred also to as CZ method) and is suitably used as a substrate for an insulated gate bipolar transistor (hereinafter referred also to as IGBT), and to a method for producing the silicon wafer.

2. Description of the Related Art

An insulated gate bipolar transistor (IGBT) has a structure including a MOSFET provided with a PN junction for hole injection. In the structure, a gate and an emitter are formed on a front surface side of an $n^-$ type silicon layer with high resistivity, and a collector is formed on the back surface side thereof over the PN junction.

The IGBT is a device in which an electric current between the collector and the emitter is controlled by an electric voltage applied to the gate being provided on a silicon oxide film. Due to the hole injection from the collector to the $n^-$ type silicon layer positioned between the gate and the emitter side and the collector side, the IGBT has features that an on-resistance may be reduced and that it is not easily destroyed even if a high electric current flows therethrough.

The IGBT controls an electric current by the gate provided on the oxide film, as described above, it is accordingly desirable for the gate oxide film to be free from defects. In addition, since the electric current flows between the emitter on the front surface of the device and the collector on the back surface, defects in a wafer have a large influence on the properties of the IGBT. Therefore, in the prior art, an epitaxial layer of an epitaxial wafer or a silicon wafer formed through a FZ method has been used as a substrate for the IGBT.

However, an n type silicon layer for providing an IGBT with high breakdown voltage is required to have a thickness of approximately 150 μm. In order to realize such a thickness by means of the epitaxial layer, a long time is required for an epitaxial growth process, and therefore the problem is that a significant increase in production cost cannot be avoided.

On the other hand, in the case of forming a silicon wafer through the FZ method, the amount of impurities contaminated during a production process is small, and therefore it is possible to obtain a wafer with relatively less defects compared to the case through the CZ method. However, the problems are that it is difficult to obtain a wafer having large diameter through the FZ method and that the FZ method is not appropriate for mass production.

Meanwhile, silicon wafers formed through the CZ method include defects caused from microscopic voids of 0.1 to 0.3 μm in size. If such defects are exposed to the surface of a wafer, the defects form pits on the wafer surface. These defects are generally called as COP (Crystal Originated Particle). It has been impossible to use a wafer having COPs as it stands as a substrate for an IGBT.

Considering the above, as described in Patent Documents 1 and 2, methods for producing a wafer has been developed, in which the number of COPs is reduced by performing a heat treatment on a wafer obtained through the CZ method.

Patent Document 1: International Publication WO2004/073057 pamphlet

Patent Document 2: Japanese Unexamined Patent Publication No. 2006-344823

SUMMARY OF THE INVENTION

The CZ method enables to produce easily a wafer having large diameter, and there has been realized mass production of wafers with diameter of 300 mm. Therefore, the CZ method is suitable for obtaining a wafer to be used as a substrate for LSI. However, a wafer obtained through the CZ method has not been used as a substrate for an IGBT because of the following reasons.

The first reason is a poor yield of GOI (Gate Oxide Integrity). That is, in a wafer obtained through the CZ method, excess vacancies are aggregated during the growth of a single crystal to result COPs as void defects of 0.2 to 0.3 μm in size. If surface pits formed by the exposure of COPs on the wafer surface or COPs existing in the vicinity of the wafer surface are captured into the oxide film during a thermal oxidation process, GOI property deteriorates.

The second reason is that the existence of oxygen donors causes lower resistivity. A silicon wafer obtained through the CZ method includes excess oxygen in the order of $1 \times 10^{18}$ atoms/cm$^3$ (Fourier transform infrared spectroscopy ASTM F-121). Therefore, in the case of being processed through a lower temperature heat treatment of approximately 450° C., oxygen donors are caused to occur and the resistivity of a substrate is decreased, and as a result, the breakdown voltage between the collector and the emitter becomes lower.

The third reason is the occurrence of oxygen precipitates. As described above, a silicon wafer obtained through the CZ method generally includes oxygen in the order of $1 \times 10^{18}$ atoms/cm$^3$. Accordingly, during a heat treatment required in a device producing process, excess oxygen precipitates as $SiO_2$, thereby causing a leakage between the collector and the emitter.

The fourth reason is a poor homogeneity in resistivity. Resistivity of a silicon wafer obtained through the CZ method is controllable by varying the amount of dopant to be doped in a polycrystalline silicon. However, because of a small segregation coefficient of phosphorus, which is an element used in the substrate for an IGBT, concentration of phosphorus varies significantly in the longitudinal direction of a single crystal ingot. Therefore, wafers having a specific resistivity can be obtained only from a limited portion of the single crystal ingot.

The techniques disclosed in Patent Documents 1 and 2 enable elimination of COPs, which are the factors deteriorating the GOI property, and allow to avoid the deterioration in the breakdown voltage between the collector and the emitter caused from the oxygen donors and the leakage between the collector and the emitter caused from the oxygen precipitates. Therefore, the techniques may be applicable as a method for producing silicon wafers for IGBT.

However, because a high temperature heat treatment is required to eliminate COPs, it is difficult to avoid a contamination and an occurrence of slip dislocations during the heat treatment. There are high possibilities that contaminated wafers with metal elements during the heat treatment cause leaks between collectors and emitters, and that wafers crack when wafers having slip dislocations are heat treated during a device production process.

The object of the present invention is, therefore, to provide a silicon wafer which is formed through a CZ method and is suitably used as a substrate for an IGBT and a method for producing the same.

According to an aspect of the present invention, there is provided a method for producing a silicon wafer. The method comprises forming, by a Czochralski method, a silicon ingot having an interstitial oxygen concentration of not more than $7.0×10^{17}$ atoms/cm³ and including a COP occurring region with a diameter not more than 90% of a diameter of a crystal, slicing a wafer from the silicon ingot after doping the silicon ingot with phosphorus, forming a polysilicon layer or a strained layer on one main surface of the wafer, and mirror polishing the other main surface of the wafer.

According to another aspect of the present invention, there is provided a silicon wafer. The silicon wafer has an oxygen concentration of not more than $7.0×10^{17}$ atoms/cm³, that the silicon wafer is doped with phosphorus such that the wafer has a resistivity fluctuating in a surface of the silicon wafer within a range of not more than 5%, that the silicon wafer includes a region from where a light scattering particle with a size of not less than 0.03 μm is detected and the region has a diameter not more than 90% of a diameter of a crystal, and that the silicon wafer has a polysilicon layer or a strained layer formed on one main surface of the wafer.

The present invention enables to provide a silicon wafer which is formed through a CZ method and is suitably used as a substrate for an IGBT.

DESCRIPTION OF THE PREFERRED EMBODIMENTS

Figure 1:
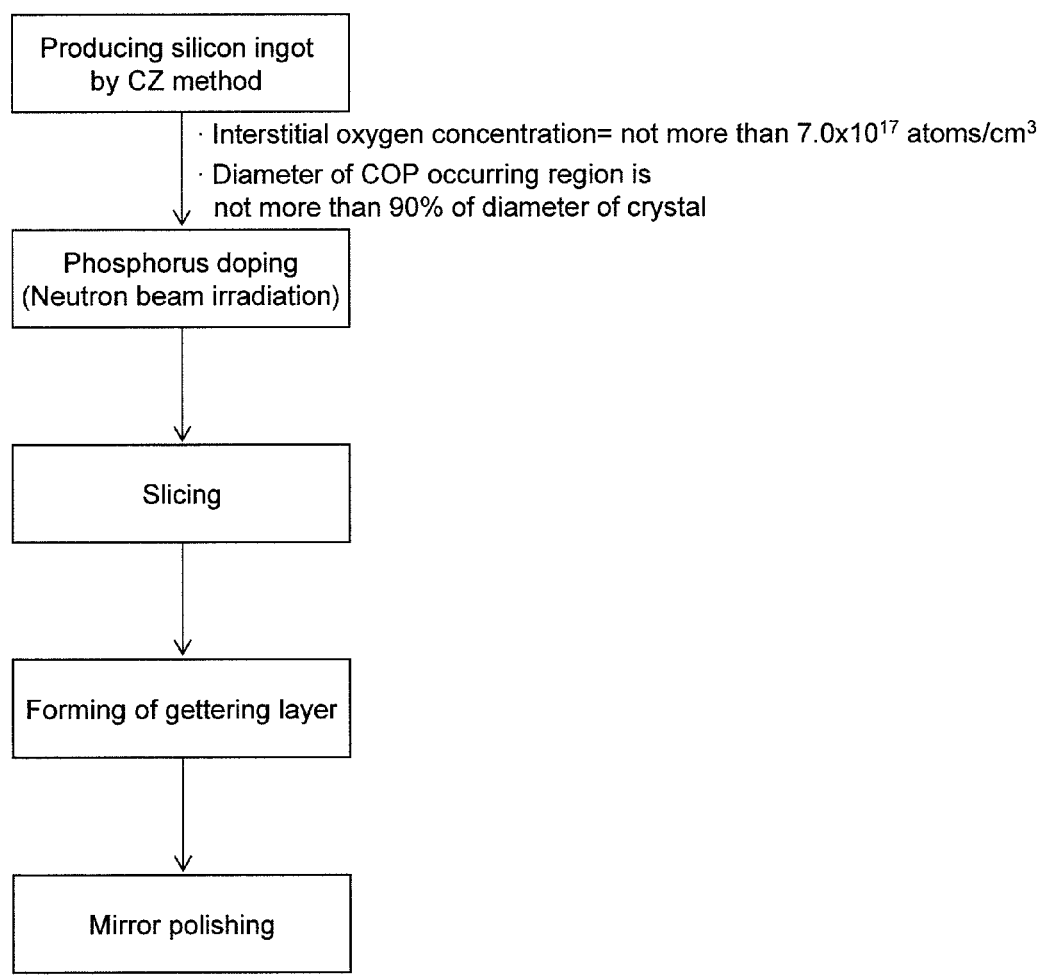
FIG. 1 is a flow chart illustrating a method for producing a silicon wafer according to the embodiment of the present invention.

Hereinafter, a method for producing a silicon wafer for an IGBT according to the embodiment of the present invention will be described in detail with reference to the drawings. FIG. 1 is a flow chart illustrating the method for producing a silicon wafer according to the present embodiment.

The method for producing a silicon wafer according to the present embodiment includes the following stages. A silicon ingot is grown by the Czochralski method (CZ method) to have an interstitial oxygen concentration of not more than $7.0×10^{17}$ atoms/cm³ (ASTM F-121) and to include a COP occurring region with a diameter not more than 90% of the diameter of the crystal. Next, after doping phosphorus into the silicon ingot by neutron irradiation, wafers are sliced from the ingot. Finally, as a gettering layer, a polysilicon layer or a strained layer is formed on one main surface of each wafer, and the other main surface of the wafer is mirror polished.

Hereinafter, each stage of the method will be described in detail.

<<Production of Ingot>>

Figure 2:
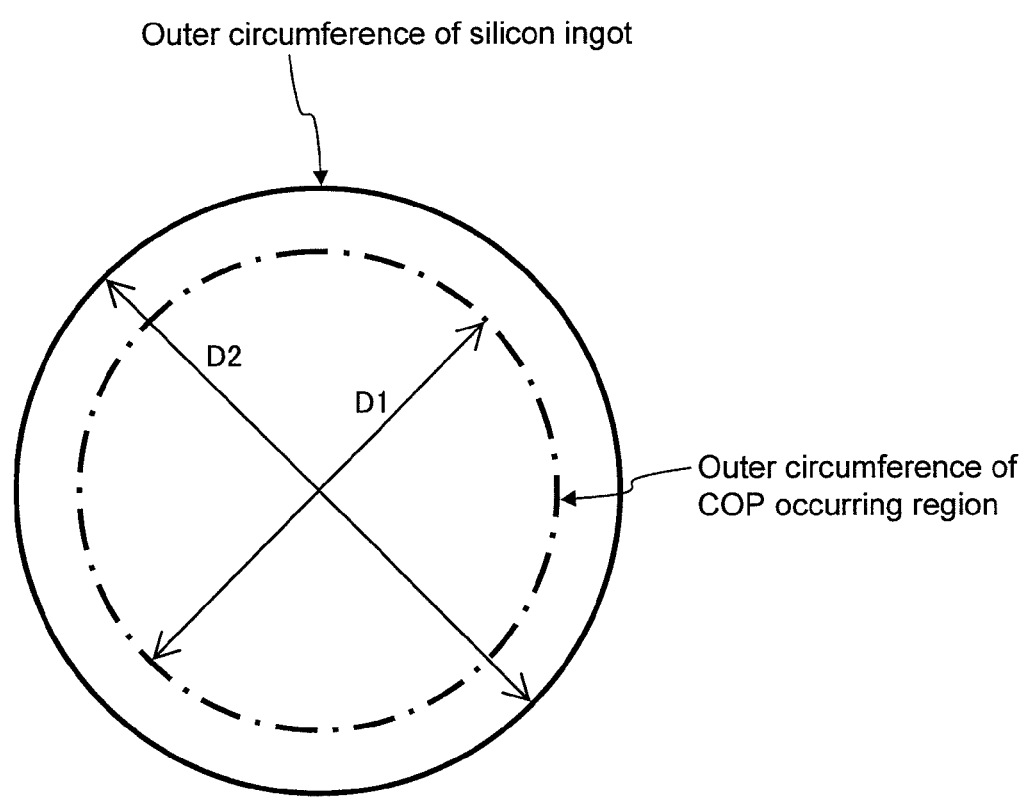
FIG. 2 is a cross-sectional view of a crystal for illustrating a diameter of a COP occurring region and a diameter of the crystal according to the embodiment of the present invention.

A silicon ingot having an interstitial oxygen concentration of not more than $7.0×10^{17}$ atoms/cm³ and including a COP occurring region with a diameter not more than 90% of the diameter of the crystal may be produced by the CZ method. It is to be noted that "the diameter of the COP occurrence region is not more than 90% of the diameter of the crystal" means that, as illustrated in FIG. 2, when a cross section of the COP occurrence region in a cross section of the silicon ingot is assumed as a circle, the diameter D1 thereof is not more than 90% of the diameter D2 of the silicon ingot. Existence or nonexistence of COPs may be confirmed by means of a bright-field infrared interferometry (an OPP (Optical Precipitate Profiler) provided from Accent Optical Technologies Co., Ltd. or the like is available).

Production of the silicon ingot by the CZ method is performed in the following steps. Firstly, blocks of polycrystalline silicon are put into a quartz crucible of a pulling apparatus. A silicon melt is obtained by heating the blocks of polycrystalline silicon in an argon atmosphere. Next, a seed crystal is immersed in the silicon melt and is gradually pulled up while rotating the seed crystal and the quartz crucible, thereby a single crystal is grown under the seed crystal.

As an example of condition in this case, there may be set a pulling condition for the single crystal growth that a ratio V/G of a growth rate V (mm/minute) of the single crystal and a temperature gradient G (° C./mm) between a melting point and 1350° C. during the single crystal growth is controlled to be approximately in a range of 0.18 to 0.24. There may be also provided an example of additional conditions of controlling the rotation speed of the quartz crucible to be 0.05 to 0.5 rpm, pressure of the argon atmosphere to be 30 Torr, and magnetic field strength to be 3500 Gauss.

By controlling the interstitial oxygen concentration of the silicon ingot to be not more than $7×10^{17}$ atoms/cm³, generation of oxygen donors during a production process of an IGBT can be inhibited. An interstitial oxygen concentration exceeding $7×10^{17}$ atoms/cm³ is not preferable, because at such a concentration, oxygen donors occur during the production process of the IGBT, and change the properties of the IGBT.

<<Phosphorus Doping>>

Next, the silicon ingot which has been produced by the above-described method is subjected to neutron beam irradiation. By the neutron beam irradiation, a certain amount of the silicon atoms are transformed to phosphorus atoms, thereby the silicon ingot which is homogeneously doped with phosphorus and has homogeneous resistivity is obtained.

When an n type silicon single crystal is doped with phosphorus by a method of adding phosphorus to a silicon melt from which the silicon single crystal is pulled, the resistivity varies along a pulling direction of the ingot. The variation of the resistivity causes changes in the properties of the IGBTs. Therefore, in the present embodiment, there is adopted a neutron irradiation method which allows the concentration of dopant to be homogeneous in an ingot as a whole.

For example, conditions for the neutron beam irradiation may be set such that at a position at which the flux of neutron beam is $3.0×10^{12}$ neutrons/cm²/s, an ingot is irradiated with the neutrons for approximately 80 hours while being rotated at a rotation speed of approximately 2 rpm. Thus, after the neutron irradiation, the resistivity of the silicon ingot becomes approximately 48Ω·cm to 52Ω·cm.

<<Slicing, Forming of Gettering Layer, Mirror Polishing, and so Forth>>

Next, wafers are sliced from the silicon ingot doped with phosphorus. Where necessary, each wafer is subjected to lapping, etching, or the like. Subsequently, a gettering layer is formed on one main surface of the wafer. The gettering layer is provided as a strained layer obtained by a sand blasting method or the like, or provided alternatively as a polysilicon film. Then, after mirror polishing the other main surface of the wafer, contaminating substances are removed from the wafer by performing a cleansing.

According to the above-described stages, there is obtained a silicon wafer suitably used as a substrate for a devise, such as an IGBT.

<<Effect of the Embodiments>>

According to the above-described method for producing silicon wafers, a silicon ingot having an interstitial oxygen concentration of not more than $7×10^{17}$ atoms/cm³ is used. Therefore, the method allows to avoid the leakage between the collector and the emitter caused from the oxygen precipitates (BMDs; Bulk Micro Defects) which are generated in a production process of an IGBT, and to avoid the deterioration in the breakdown voltage between the collector and the emitter caused from the formation of the oxygen donors.

In addition, according to the present embodiment, a crystal in which a diameter of a COP occurring region is reduced to not more than 90% of the diameter of the crystal is used. Therefore, it is possible to produce wafers including only microscopic COPs. As a result, the GOI is improved especially for an IGBT having a thick gate oxide film. Generally in a CZ silicon crystal (having an oxygen concentration of $10 \times 10^{17}$ to $20 \times 10^{17}$ atoms/cm$^3$), oxygen precipitates in the form of plates are generated in an outer region of the COP occurring region during a pulling-up of the crystal. If through a thermal oxidation, these oxygen precipitates in the form of plates act as nuclei, and an OSF (Oxidation induced Stacking Fault) is generated in a ring-shape. Nevertheless, because the wafer according to the present embodiment has an interstitial oxygen concentration of not more than $7 \times 10^{17}$ atoms/cm$^3$, the OSF is not generated through a thermal oxidation.

In addition, according to the present embodiment, by irradiating neutrons to the silicon ingot, it is possible to transform a certain amount of the silicon atoms into phosphorus atoms, thereby realizing a homogeneous doping of phosphorus in the silicon ingot from which wafers having a constant resistivity can be obtained.

In addition, according to the present embodiment, a production process of wafers is not required to have a high temperature heat treatment. Therefore, it is possible to avoid a contamination and an occurrence of slip dislocations during the heat treatment.

In addition, since the wafer has a gettering layer such as a polysilicon layer or a strained layer, which is formed on one main surface of the wafer, it is possible to eliminate a heavy metal contamination in the production process of an IGBT.

Silicon wafers obtained by the method include only microscopic COPs. Therefore, the yield of GOI is improved especially for an IGBT having a thick gate oxide film. In addition, variation of resistivity is reduced within a surface of each wafer, and among the different wafers sliced from the same ingot. Moreover, in the production process of an IGBT, generation of BMDs and change (or fluctuation) of resistivity are scarcely caused.

EXAMPLES

Examples 1 and 2, and Comparative Examples 1 and 2

At first, silicon ingots with various interstitial oxygen concentrations and with various COP regions to crystal diameters were produced by the CZ method for Examples 1 and 2, and Comparative Examples 1 and 2. More specifically, blocks of polycrystalline silicon were put into a quartz crucible, and a silicon melt was obtained by heating the blocks of polycrystalline silicon in an argon atmosphere.

Next, a seed crystal was immersed in the silicon melt, and then was gradually pulled up while rotating the seed crystal and the quartz crucible, thereby a single crystal was grown under the seed crystal.

At that time, by varying a ratio V/G of a growth rate V (mm/minute) of the single crystal and a temperature gradient G (° C./mm) between a melting point and 1350° C. during the single crystal in a range from 0.18 to 0.27, a captured amount of vacancies into the single crystal was controlled. As a result, crystals with various ratios of diameters of COP occurring regions and diameters of crystals were produced (Examples 1 and 2, and Comparative Examples 1 and 2).

The interstitial oxygen concentration for each silicon ingot was controlled by adjusting the rotation speed of the quartz crucible and the pressure of the argon atmosphere (Examples 1 and 2, and Comparative Examples 1 and 2). The oxygen concentration may be reduced by lowering the rotation speed of the quartz crucible, or by reducing a pressure of the argon atmosphere. In addition, by adopting a MCZ method (magnetic field applied Czochralski method), it becomes more easy to produce a silicon ingot with low oxygen concentration.

Thus, a silicon ingot including a COP occurring region with a diameter equal to 50% of the diameter of the crystal and having an interstitial oxygen concentration of $6 \times 10^{17}$ atoms/cc (Example 1), a silicon ingot including a COP occurring region with a diameter equal to 90% of the diameter of the crystal and having an interstitial oxygen concentration of $2 \times 10^{17}$ atoms/cc (Example 2), a silicon ingot including a COP occurring region with a diameter equal to 95% of the diameter of the crystal and having an interstitial oxygen concentration of $2 \times 10^{17}$ atoms/cc (Comparative Example 1), and a silicon ingot including a COP occurring region with a diameter equal to 80% of the diameter of the crystal and having an interstitial oxygen concentration of $8 \times 10^{17}$ atoms/cc (Comparative Example 2) were produced with each diameter of 200 mm.

Next, the silicon ingots described above were doped with phosphorus by neutron beam irradiation. The neutron beam irradiation was continued during 80 hours under the flux condition of $3.0 \times 10^{12}$ neutrons/cm$^2$/s (resultant resistivity being approximately 50Ω·cm).

After that, wafers were sliced from the silicon ingots. The sliced wafers were subjected to surface treatment such as lapping, etching, mirror polishing, and cleansing.

<<Evaluations>>

Each wafer obtained in Examples 1 and 2, and Comparative Examples 1 and 2 was evaluated with respect to a yield of GOI, a change in resistivity caused from oxygen donors, occurrence of BMDs, and occurrence of OSF.

Yields of GOI were measured with conditions of gate oxide film thickness of 90 nm, electrode area of 8 mm$^2$, and criteria electric field intensity of 11 MV/cm.

The fluctuation in resistivity was evaluated as a range within which the resistivity fluctuated in the surface of the wafer. The range was defined as a value calculated from ((maximum value of resistivity)−(minimum value of resistivity))×100/(minimum value of resistivity). The maximum value and the minimum value of resistivity were selected from measured values at measurement positions including a center of the wafer, a middle position between the center and an outer circumference of the wafer, and a position of 5 mm from the outer circumference of the wafer.

The occurrence of BMDs was evaluated by using the OPP and measuring a defects density "A" in an as-grown status and a defects density "B" after two-stage heat treatments of 800° C. during 4 hours and 1000° C. during 16 hours, and comparing the measured defects densities "A" and "B". In general, both of COPs and BMDs are detected by the OPP. Therefore, the occurrence of BMDs caused from the heat treatments was determined in case of B>A. Since defects with sizes of not less than approximately 0.03 μm are detectable by the OPP, the above-mentioned method enables to detect an occurrence of BMDs with sizes of not less than approximately 0.03 μm.

The occurrence of OSF was evaluated by performing a heat treatment of 1150° C. during 2 hours in an oxygen atmosphere including water vapor, and thereafter performing a selective etching by a Wright solution, and observing etch pits.

The change in resistivity caused from the occurrence of oxygen donors was evaluated by measuring a resistivity "C" by using a four-point probe method after a heat treatment of 650° C. during 30 minutes, measuring a resistivity "D" by using a four-point probe method after the heat treatment of 650° C. during 30 minutes and a further heat treatment of 450° C. during 1 hour, and comparing the measured resistivities "C" and "D".

The rate of change (%) was defined as ((D−C)/C)×100.
<<Evaluation Results>>

Table 1 illustrates evaluation results with respect to Examples 1 and 2, and Comparative Examples 1 and 2.

TABLE 1

|  | Interstitial oxygen concentration ($\times 10^{17}$ atoms/cc) | COP region to crystal diameter (%) | Yield of GOI | Change in resistivity (%) | Occurrence of BMDs | Occurrence of OSF |
|---|---|---|---|---|---|---|
| Example 1 | 6 | 50 | 100 | −1.1 | none | none |
| Example 2 | 2 | 90 | 95 | 0 | none | none |
| Comparative Example 1 | 2 | 95 | 80 | 0 | none | none |
| Comparative Example 2 | 8 | 80 | 100 | −6.3 | occurred | occurred |

As apparent from the evaluation results, each wafer obtained through Examples 1 and 2, which had an interstitial oxygen concentration of not more than $7.0 \times 10^{17}$ atoms/cm$^3$ and included a COP occurring region with a diameter not more than 90% of a diameter of the crystal, had advantages that the yield of GOI was good, that the change in resistivity was within an acceptable range, and that neither of the occurrence of BMDs nor the occurrence of OSF was observed.

On the other hand, the wafer obtained through Comparative Example 1, which had an interstitial oxygen concentration of not more than $7.0 \times 10^{17}$ atoms/cm$^3$ and included a COP occurring region with a diameter exceeding 90% of a diameter of the crystal, had features that the change in resistivity was within an acceptable range, and that neither of the occurrence of BMDs nor the occurrence of OSF was observed. However, in the wafer, sizes of COPs were large and the yield of GOI was poor.

In addition, the wafer obtained through Comparative Example 2, which included a COP occurring region with a diameter not more than 90% of a diameter of the crystal and had an interstitial oxygen concentration exceeding $7.0 \times 10^{17}$ atoms/cm$^3$, had a feature that sizes of COPs were small and the yield of GOI was good. However, in the wafer, the change in resistivity was significant and both of the occurrence of BMDs and the occurrence of OSF were observed.

As described above, the silicon wafers produced according to the present examples have features that the interstitial oxygen concentration is not more than $7.0 \times 10^{17}$ atoms/cm$^3$, and that sizes of COPs and COP occurring region are reduced.

Therefore, if through a heat oxidization, an OSF is prevented from occurring in an outer region of the COP occurring region. In addition, because of not requiring a high temperature heat treatment, it is possible to avoid a contamination and an occurrence of slip dislocations during the heat treatment. Accordingly, such wafers may be used suitably as substrates for IGBTs.

The invention claimed is:

1. A method for producing a silicon wafer for IGBT, comprising:
   forming a silicon ingot by a Czochralski method, the silicon ingot having an interstitial oxygen concentration of not more than $7.0 \times 10^{17}$ atoms/cm$^3$, the silicon ingot including a COP occurring region with a diameter equal to 50% or more and not more than 90% of a diameter of a crystal;
   doping the silicon ingot with phosphorus;
   slicing a wafer from the silicon ingot;
   forming a polysilicon layer or a strained layer on one main surface of the wafer; and
   mirror polishing the other main surface of the wafer.

2. The method for producing a silicon wafer as set forth in claim 1, wherein
   the doping with phosphorus is performed by a neutron irradiation.

3. The method for producing a silicon wafer as set forth in claim 1, wherein
   a pulling condition for a single crystal growth is set in the Czochralski method, the pulling condition including a ratio V/G of a growth rate V (mm/minute) of the single crystal and a temperature gradient G (° C./mm) between a melting point and 1350° C. during the single crystal growth, the ratio V/G being in a range of 0.18 to 0.24.

4. A silicon wafer comprising:
   a silicon wafer having an oxygen concentration of not more than $7.0 \times 10^{17}$ atoms/cm$^3$;
   the silicon wafer being doped with phosphorus such that the wafer has a resistivity fluctuating in a surface of the silicon wafer within a range of not more than 5%, the resistivity fluctuating in a surface of the silicon wafer being defined as a value obtained from ((maximum value)−(minimum value))×100/(minimum value), the maximum value and the minimum value being selected from measured values at measurement positions including a center of the silicon wafer, a middle position between the center and an outer circumference of the silicon wafer, and a position of 5 mm from the outer circumference;
   the silicon wafer including a region from where a light scattering particle with a size of not less than 0.03 μm is detected, the region having a diameter equal to 50% or more and not more than 90% of a diameter of a crystal; and
   the silicon wafer having a polysilicon layer or a strained layer formed on one main surface of the wafer.

5. The silicon wafer as set forth in claim 4, wherein
   the silicon wafer is a wafer as a substrate for IGBT.

* * * * *